United States Patent
Koba et al.

(10) Patent No.: US 10,429,444 B2
(45) Date of Patent: *Oct. 1, 2019

(54) STATE OF CHARGE DETECTION DEVICE

(71) Applicant: Primearth EV Energy Co., Ltd., Kosai-shi, Shizuoka (JP)

(72) Inventors: Daisuke Koba, Toyohashi (JP); Sachio Takeda, Toyohashi (JP); Katsunori Maegawa, Toyohashi (JP); Tetsuya Osaka, Nishitokyo (JP)

(73) Assignee: PRIMEARTH EV ENERGY CO., LTD., Kosai-Shi (JP)

( * ) Notice: Subject to any disclaimer, the term of this patent is extended or adjusted under 35 U.S.C. 154(b) by 545 days.

This patent is subject to a terminal disclaimer.

(21) Appl. No.: 14/343,743

(22) PCT Filed: Sep. 26, 2012

(86) PCT No.: PCT/JP2012/074722
§ 371 (c)(1),
(2) Date: Mar. 7, 2014

(87) PCT Pub. No.: WO2013/114669
PCT Pub. Date: Aug. 8, 2013

(65) Prior Publication Data
US 2014/0229130 A1    Aug. 14, 2014

(30) Foreign Application Priority Data
Jan. 31, 2012 (JP) .................... 2012-018746

(51) Int. Cl.
*G01R 31/36* (2019.01)
*G01R 31/382* (2019.01)
(Continued)

(52) U.S. Cl.
CPC ....... *G01R 31/3648* (2013.01); *G01R 31/382* (2019.01); *G01R 31/389* (2019.01);
(Continued)

(58) Field of Classification Search
CPC ............ G01R 31/3648; G01R 31/3606; G01R 31/3662
See application file for complete search history.

(56) References Cited

U.S. PATENT DOCUMENTS

| 4,743,855 A | 5/1988 | Randin |
| 5,241,275 A | 8/1993 | Fang |

(Continued)

FOREIGN PATENT DOCUMENTS

| DE | 10 2009 000 337 A1 | 7/2010 |
| DE | 10 2009 000337.1 A1 | 7/2010 |

(Continued)

OTHER PUBLICATIONS

Extended European Search Report dated May 17, 2016, issued in corresponding European Patent Application No. 16 15 1183, filed Sep. 26, 2012, 8 pages.

(Continued)

*Primary Examiner* — Leslie J Evanisko
*Assistant Examiner* — Leo T Hinze
(74) *Attorney, Agent, or Firm* — Christensen O'Connor Johnson Kindness PLLC

(57) ABSTRACT

The present invention pertains to the detection of the state of charge of a battery, whereby the complex impedance in the diffusion region of the battery is used. An arithmetic device such as a computer determines the slope of the complex impedance at least two different frequencies in the diffusion region of a rechargeable battery when a straight-line approximation has been made. The state of charge of the rechargeable battery is detected by using the slope that has (Continued)

been determined, and the relationship between the state of charge and slopes that have been stored in advance in a storage means.

5 Claims, 7 Drawing Sheets

(51) Int. Cl.
*H01M 10/48* (2006.01)
*H02J 7/04* (2006.01)
*G01R 31/392* (2019.01)
*G01R 31/389* (2019.01)
*G01R 31/367* (2019.01)

(52) U.S. Cl.
CPC .......... *G01R 31/392* (2019.01); *H01M 10/48* (2013.01); *H02J 7/044* (2013.01); *G01R 31/367* (2019.01)

(56) References Cited

U.S. PATENT DOCUMENTS

| | | | |
|---|---|---|---|
| 5,717,336 A * | 2/1998 | Basell | G01R 31/3662 324/430 |
| 6,477,024 B1 | 11/2002 | Kikuchi et al. | |
| 7,541,814 B2 * | 6/2009 | De Doncker | G01R 31/3662 324/426 |
| 7,847,557 B2 * | 12/2010 | Yun | G01R 31/3651 324/426 |
| 9,354,278 B2 * | 5/2016 | Koba | G01R 31/3651 |
| 2001/0028238 A1 | 10/2001 | Nakamura | |
| 2002/0030495 A1 | 3/2002 | Kechmire | |
| 2012/0019253 A1 | 1/2012 | Ziegler et al. | |
| 2014/0218042 A1 | 8/2014 | Koba | |

FOREIGN PATENT DOCUMENTS

| | | |
|---|---|---|
| EP | 0 146 093 A2 | 6/1985 |
| EP | 0 516 336 A2 | 12/1992 |
| JP | 60-144675 A | 7/1985 |
| JP | 5-135806 A | 6/1993 |
| JP | 05-135806 A | 6/1993 |
| JP | 08-043506 A | 2/1996 |
| JP | 10-232273 A | 9/1998 |
| JP | 2000-299137 A | 10/2000 |
| JP | 2011-158444 A | 8/2011 |
| JP | 2011158444 A | 8/2011 |

OTHER PUBLICATIONS

Notice of Allowance dated Feb. 23, 2016, from U.S. Appl. No. 14/343,720, filed Mar. 7, 2014, 8 pages.
International Search Report dated Jan. 8, 2013, issued in corresponding International Application No. PCT/JP2012/074722, filed Sep. 26, 2012, 5 pages.
Koba, D. et al., "Battery State Detection Device," U.S. Appl. No. 14/343,720, filed Mar. 7, 2014.
International Preliminary Report on Patentability dated Aug. 5, 2014, issued in corresponding International Application No. PCT/JP2012/074722, filed Sep. 26, 2012, 9 pages.
International Preliminary Report on Patentability dated Aug. 5, 2014, issued in International Application No. PCT/JP2013/051343, filed Jan. 23, 2013, 8 pages.
Notice of Grounds for Rejection dated Mar. 15, 2016, issued in corresponding Japanese Application No. 2013-556195, filed Sep. 26, 2012, 5 pages.
Do, D.V., et al., "Impedance Observer for a Li-Ion Battery Using Kalman Filter," IEEE Transactions on Vehicular Technology 58(8):3930-3937, Oct. 2009.
Extended European Search Report dated Mar. 24, 2015, issued in corresponding European Patent Application No. EP 12 86 7453, filed Sep. 26, 2012, 8 pages.
Blanke, H., et al., "Impedance Measurements on Lead-Acid Batteries for State-of Charge, State-of-Health and Cranking Capability Prognosis in Electric and Hybrid Electric Vehicles," Journal of Power Sources 144(2):418-425, Jun. 15, 2005.
Extended European Search Report dated Sep. 1, 2015, issued in European Patent Application No. EP 13744278.6, filed Jan. 23, 2013, 9 pages.
Office Action dated Nov. 5, 2015, from U.S. Appl. No. 14/343,720, filed Mar. 7, 2014, 6 pages.

* cited by examiner

STATE OF CHARGE DETECTION DEVICE

TECHNICAL FIELD

The present invention relates to a device for detecting a state of charge of a battery and, more particularly, to a technique of detecting a state of charge of a rechargeable battery by analysis of complex impedances.

BACKGROUND ART

A technique of evaluating a state of deterioration a battery and its remaining lifetime by analysis of impedances of the battery has hitherto been proposed.

For instance; Patent Document 1, describes a method for measuring a state of an electrical discharge of a battery having internal impedance. The method includes measuring a first internal impedance of the battery at a first frequency; measuring a second internal impedance of the battery at a second frequency; determining a difference between the first internal impedance and the second internal impedance; and determining a deflection angle or an argument that represents the difference between the internal impedances; in other words, a deflection angle or an argument that represents a state of an electrical discharge of the battery. Further, the first frequency or the second frequency, whichever is lower, exists between 0.1 Hz and 10 Hz.

Patent Document 2 includes a description about detecting a quantity of electricity associated with impedance of a rechargeable battery or a quantity of electricity associated with maximum output density by application of an AC voltage to the rechargeable battery and determining performance of the rechargeable battery on the basis of the quantity of electricity. Another description also states that the quantity of electricity is an AC-impedance-associated electrical quantity associated with, of impedances of the rechargeable battery, an AC impedance component made up of a component which varies according to a frequency of an AC voltage. Still another description states that a real-axis component value and an imaginary-axis component value of an impedance of the rechargeable battery are determined for each frequency value by applying AC voltages of a plurality of frequency values in a predetermined frequency band to the rechargeable battery and that a quantity of electricity associated with impedance is calculated from the real-axis component value and the imaginary-axis component value. A further additional description states that an AC impedance component is calculated from a circular locus of impedance in a two-dimensional plane defined by an axis representing the real-axis component values and another axis representing the imaginary-axis component values.

RELATED ART DOCUMENTS

Patent Documents

Patent Document 1: JP-A-60-144675
Patent Document 2: JP-A-2000-299137

SUMMARY OF THE INVENTION

Incidentally, along with the recent popularization of hybrid automobiles and pure electric vehicles, establishing technology of detecting a state of a rechargeable battery mounted in such a vehicle with high accuracy has become imperative. Applications of the technology to controlling the rechargeable battery mounted in a vehicle and recycling the rechargeable battery can be expected. For instance, on the occasion of recycling of a rechargeable battery, a technique of determining whether or not the rechargeable battery is recyclable, from battery characteristics (an open circuit voltage, internal resistance, remaining capacity, and the like) of the rechargeable battery taken out of the vehicle has already been put forward. However, in order to make a more accurate determination as to whether or not the rechargeable battery is recyclable, a technique of detecting a state of a rechargeable battery more accurately has been desired. In addition, the patent documents include a description about detecting a state of a rechargeable battery by means of an impedance. However, the state of the battery is detected by use of an impedance in a so-called charge transfer resistance region, and it cannot necessarily be said that the state of the battery is sufficiently detected. In relation to; for instance, a nickel-metal hydride battery, even when a change has occurred in an SOC, no change appears in the impedance in the charge transfer resistance region. Therefore, the SOC cannot be estimated from the impedance in the charge transfer resistance region.

The present invention aims at providing a device capable of detecting a state of charge of a battery with high accuracy by analysis of complex impedances of the battery.

The present invention provides a device for detecting a state of charge of a battery, comprising: measurement means for measuring complex impedances in a diffusion region of the battery; detection means for calculating a slope of a straight light or an approximate straight line which connects together two complex impedances or more of different frequencies in the diffusion region of the battery measured by the measurement means; and storage means that preliminarily stores correlations between a slope and a state of charge, wherein the detection means detects the state of charge of the battery by use of the calculated slope and the correlations between the slope and the state of charge stored in the storage means.

The present invention also provides a device for detecting a state of charge of a battery comprising: measurement means for measuring a complex impedance, in a diffusion region of a battery, whose frequency is identical with a frequency of a reference complex impedance which is a complex impedance in a diffusion region of the base battery that serves as a reference on occasion of comparison of the battery; detection means for detecting a distance between the reference complex impedance and the complex impedance measured by the measurement means; and storage means that preliminarily stores correlations between a distance and a state of charge, wherein the detection means detects the state of charge of the battery by use of the calculated distance and the correlations between the distance and the state of charge stored in the storage means.

In one embodiment of the present invention, the detection means detects a slope of a straight line that connects together the reference complex impedances and the complex impedance measured by the measurement means as well as a distance between the reference complex impedance and the complex impedance measured by the measurement means; the storage means preliminarily stores correlations between a slope and a state of charge as well as correlations between a distance and a state of charge; and the detection detects the state of charge of the battery by use of the calculated slope and the correlations between the slope and the state of charge stored in the storage means as well as the calculated distance and the correlations between the distance and the state of charge stored in the storage means.

The present invention enables highly accurate detection of a state of charge of a battery to be detected by means of analysis of complex impedances of the battery. Accordingly, recycling efficiency can be enhanced by application of the present invention to; for instance, an occasion of accurate control of a vehicle-mounted battery or recycling of the battery.

EMBODIMENTS FOR IMPLEMENTING THE INVENTION

Embodiments of the invention are hereunder described by reference to the drawings.

<Fundamental Principle>

A basic principle underlying embodiments is first described. A device for detecting a state of charge of a rechargeable battery described in connection with the embodiment is intended for detecting a state of charge of a rechargeable battery by focusing attention on a behavior in a specific frequency region among the behaviors of a complex impedance of the rechargeable battery. Explanations are provided hereunder by taking a nickel-metal hydride battery (Ni—MH battery) as, by way of example, a rechargeable battery. The present invention; however, is not limited to the nickel-metal hydride battery and can also be utilized for; e.g., another alkaline battery or a nonaqueous battery, such as a lithium battery.

Figure 1:
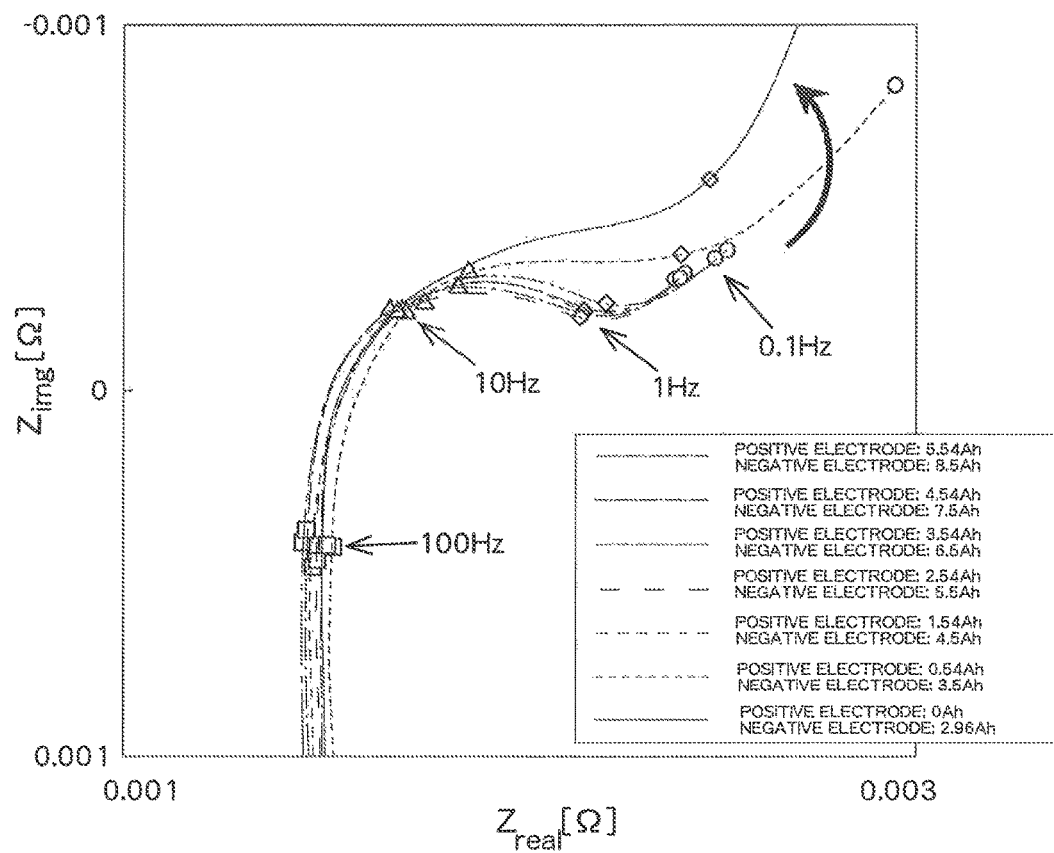
FIG. 1 It is a complex impedance chart (a Nyquist plot) of a battery.

FIG. 1 illustrates complex impedance curves made by connecting together complex impedances of a circuit that is equivalent to the application of an AC voltage to a battery in a discharged state while a frequency of the voltage is changed. The equivalent circuit and the complex impedance are known and exactly as described even in connection with; for instance, Patent Document 2. To put it briefly, an impedance of a battery is expressed by an equivalent circuit including a DC impedance component and an AC impedance component that are connected in series, and the AC impedance component is made equivalent to a parallel circuit including a resistor and a capacitor. The AC impedance component is obtained as $Z=Vac/Iac=Zrea+jZimg$ by eliminating the DC voltage component from a voltage across the battery to thus detect an AC voltage component Vac and an AC current Iac applied to both terminals of the battery. Reference symbol Zreal (ZR) is a real-axis component of a complex impedance, and reference symbol Zimg (Zi) is an imaginary-axis component of the complex impedance. FIG. 1 illustrates that a real-axis component and an imaginary-axis component of a complex impedance of the battery are determined and that a pair of data including the real-axis component and the imaginary-axis component are plotted on a two dimensional plane defined by a horizontal axis Zr representing real-axis components Zr and a vertical axis representing imaginary-axis components Zi (i.e., a Nyquist plot: a right side of the horizontal axis is a plus side; left side of the same is a minus side; an upper side of the longitudinal axis is a minus side; and a lower side of the vertical axis is a plus side: and the same also applies to other Nyquist plots). Illustrated are real-axis components and imaginary-axis components of complex impedances that are acquired while a frequency applied to the battery in a discharged state is changed at given capacities (a capacity of the positive electrode (Ah), a capacity of the negative electrode (Ah))= (5.54, 8.5), (4.54, 7.5), (3.54, 6.5), (2.54, 5.5), (1.54, 4.5), (0.54, 3.5), and (0, 2.96). The chart explicitly illustrates a point of 0.1 Hz, a point of 1 Hz, a point of 10 Hz, and a point of 100 Hz. Specifically, a circular symbol denotes 0.1 Hz; a rhombic symbol denotes 1 Hz; a triangular symbol denotes 10 Hz; and a square symbol denotes 100 Hz. A low frequency region is a region which is made up of complex impedances contributed to mass diffusion, and, in the embodiment, is referred to as a region made up of complex impedances in a diffusion region. Specifically, each of the complex impedance curves illustrated in FIG. 1 is formed from a curve portion (a charge transfer resistance region) that shows a high-frequency-side circular arc and a nearly straight portion. A portion (a nearly-straight portion) of the complex impedance curve continued from a point of inflexion up to a low frequency region is a region made up of complex impedances in the diffusion region.

By virtue of assiduous studies, the inventors found a correlation between a complex impedances in a diffusion region and a state of charge (SOC) of a battery, having come to conceive the present invention. Specifically, the present invention lies in detecting a state of charge (SOC) of a battery by use of complex impedances in the diffusion region. Configurations and details of processing of embodiments are hereunder described in more detail.

First Embodiment

In a present embodiment, a state of charge (SOC) of a battery 10 is detected by use of a slope of a straight line that connects together two complex impedances of different frequencies in a diffusion region (hereinafter called a "slope of a complex impedance in a diffusion region"). To be specific, as illustrated in FIG. 1, the slope of the complex impedance in the diffusion region changes in accordance with capacity of a positive electrode and capacity of a negative electrode. More specifically, since a correlation exists between an SOC and a slope, utilization of this fact enables evaluation of the SOC of the battery 10 through use of the slope of the complex impedance in the diffusion region. The present embodiment provides descriptions about such detection of the SOC.

Figure 2:
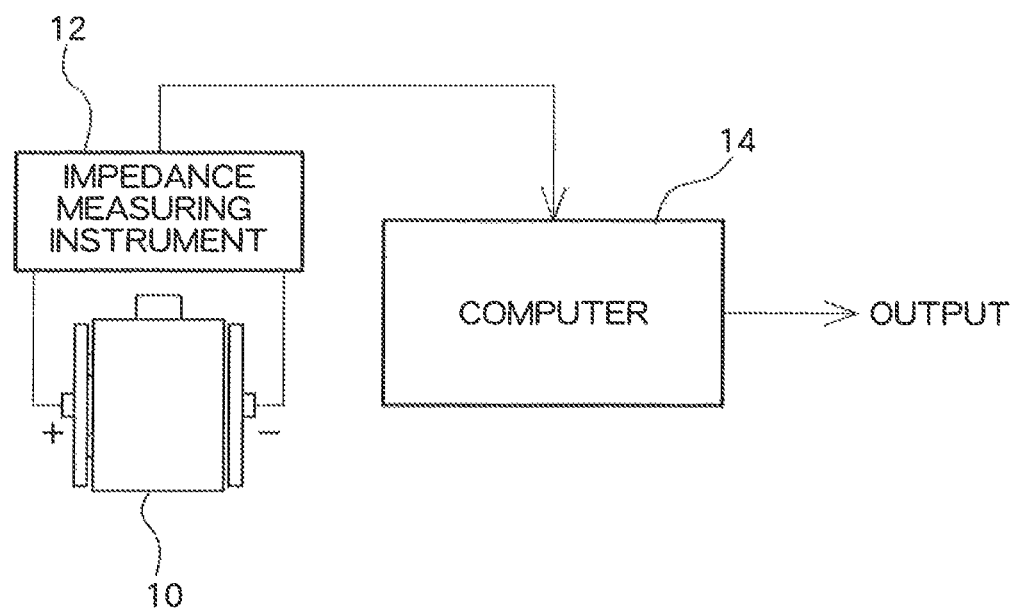
FIG. 2 It is a block diagram of a state of charge detection device of an embodiment.
Figure 3:
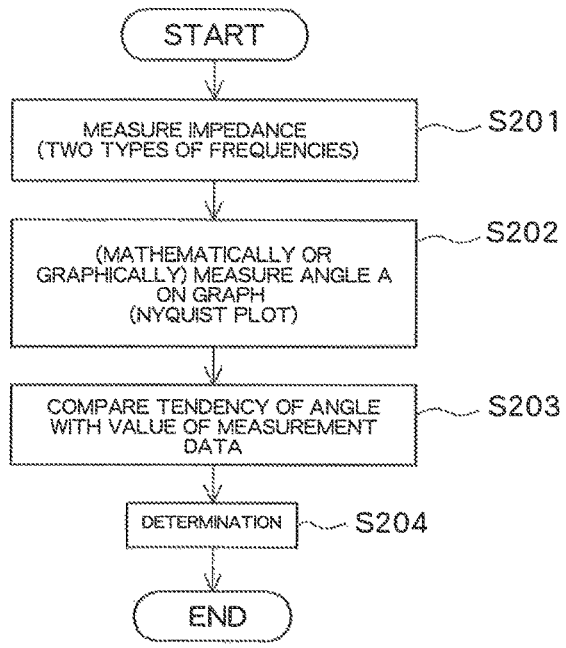
FIG. 3 It is a processing flowchart of a first embodiment.

FIG. 2 illustrates an entire configuration of a state of charge detection device of the embodiment. The state of charge detection device includes an impedance measuring instrument (or an impedance analyzer) 12 that is measurement means for measuring a complex impedance of the battery 10 by application of an AC voltage to the battery 10 to be detected and a CPU of a computer 14 that is supplied with data pertinent to two complex impedances of different frequencies in the diffusion region of the battery 10 measured by the impedance analyzer 12 and that calculates a slope of a straight line connecting together the sets of complex impedance data. The computer 14 additionally has memory that is storage means which preliminarily stores correlations between a slope and a state of charge. The CPU of the computer 14 detects a state of charge of the battery 10 by use of the computed slope and the correlations stored in the memory. Further, FIG. 3 shows a processing flowchart of the present embodiment. First, measurement electrodes are connected to the battery 10, and an AC voltage is applied to the battery 10. The impedance measurement device 12 measures complex impedances of the battery 10 (S201). A frequency of the AC voltage to be applied to the battery 10 is at least two frequencies in the diffusion region; for instance, 0.1 Hz and 0.5 Hz. However, the frequencies of the AC voltage are not limited to them.

Figure 4:
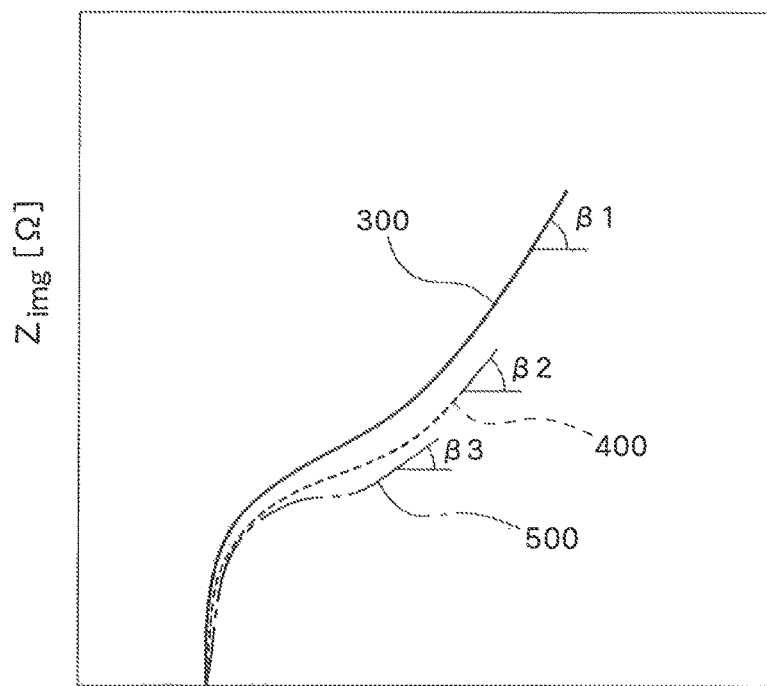
FIG. 4 It is a schematic explanatory view (a Nyquist plot) of the first embodiment.

The computer 14 then calculates a slope in the diffusion region; namely, a slope of a graph (a Nyquist plot) in FIG. 4 or the like, by use of the data pertinent to the complex impedances at two frequencies measured by the impedance measuring instrument 12 (S202). The slope can also be computed by either a mathematical or graphical (geometrical) method. Alternatively, provided that a complex impedance measured at a relatively higher one of the two frequencies is taken as a first complex impedance and that a complex impedance measured at a relatively lower frequency is taken as a second complex impedance, a slope of a straight line that connects the first complex impedance to the second complex impedance is calculated.

The computer 14 next compares the correlations between the SOC and the slope preliminarily stored in the memory with the calculated slope (S203), thereby determining the SOC of the battery 10 from a comparison result (S204). The correlation s between the SOC and the slope have preliminarily been measured in connection with a plurality of batteries. The thus-measured correlations are specified as functions or a table and stored in the memory.

FIG. 4 illustrates complex impedances in the diffusion region of batteries with various SOC levels. In the drawing, reference numeral 300 designates a complex impedance of a nickel-metal hydride battery with 10% SOC; 400 designates a complex impedance of a nickel-metal hydride battery with 20% SOC; and 500 designates a complex impedance of a nickel-metal hydride battery with 60% SOC. Slopes in the diffusion region achieved at the respective SOC levels are not identical with each other. Slopes tend to become smaller with an increase in SOC. Specifically, assuming that a slope of 10% SOC, a slope of 20% SOC, and a slope of 60% SOC are taken as β1, β2, and β3, there exists a correlation of β1>β2>β3.

Figure 5:
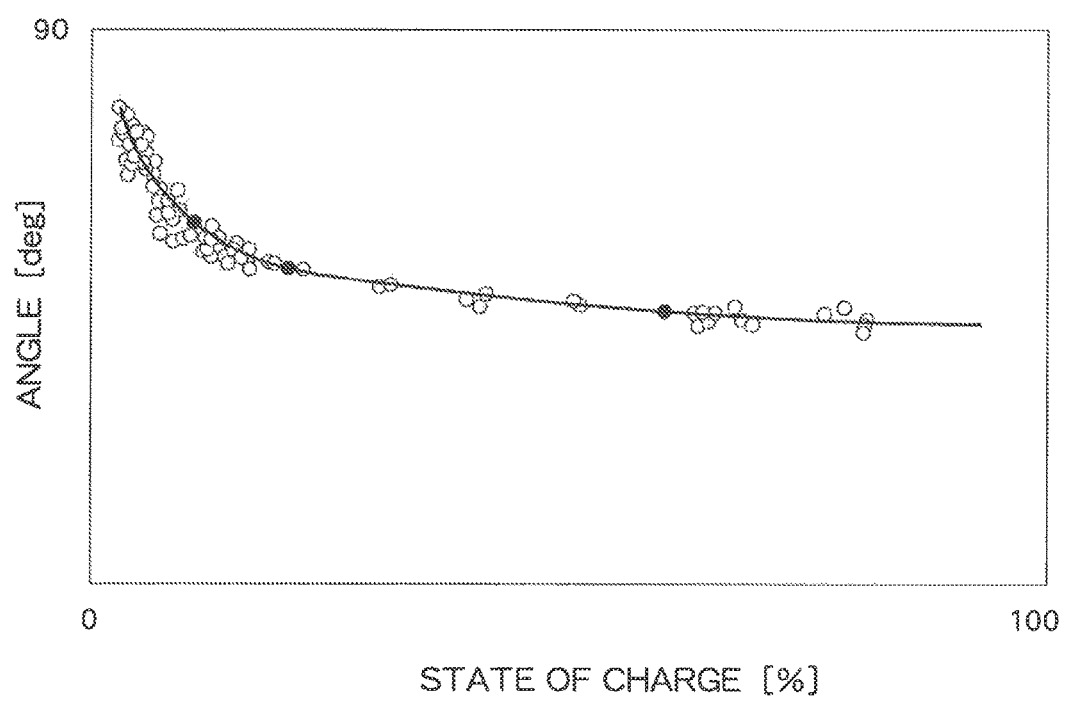
FIG. 5 It is a graph chart illustrating a relationship between a state of charge and a slope.

FIG. 5 illustrates a correlation between an SOC of the nickel-metal hydride battery and a slope. A horizontal axis represents a state of charge (SOC) (%), whilst a vertical axis represents a slope, or an angle, (deg) in the diffusion region. As mentioned above, a given correlation exists between an SOC and a slope, and the slope tends to decrease with an increase in SOC. In particular, when the SOC has a small value (about 0% to 10%), a change in slope that is commensurate with a change in SOC is large. In the present embodiment, the correlation between the SOC and the slope illustrated in FIG. 5 is preliminarily specified as a function or a table and stored in the memory. An SOC is uniquely detected by reference to the slop of the battery 10 obtained by computation. As is seen from FIG. 5, when the SOC assumes a small value, an error in SOC determined from the slope is smaller than an error in SOC that is determined from the slope when the SOC assumes a large value. In particular, therefore, there will become appropriate use of the method of the invention according to any purpose. For instance, when the SOC of the battery 10 assumes a comparatively large value (e.g., 50% or more), the SOC of the battery 10 is determined by means of another method. On the contrary, when the SOC of the battery 10 is comparatively small (e.g., 10% or less), the SOC of the battery 10 is detected with high accuracy by means of the method of the present embodiment.

Second Embodiment

In the present embodiment, the SOC of the battery 10 is detected by use of a slope of a straight line (hereinafter referred to as a "slope of a complex impedance in a diffusion region") that connects a reference complex impedance in the diffusion region of abase battery, which is to serve as a reference during comparison of the battery 10, with a complex impedance of the same frequency as that of the reference complex impedance in the diffusion region of the battery 10 as well as a distance between the reference complex impedance and the complex impedance of the same frequency as that of the reference complex impedance in the diffusion region of the battery 10. In place of the measurement means of the first embodiment, the impedance measuring instrument (or the impedance analyzer) 12 serving as measurement means measures a complex impedance of the same frequency as that of the reference complex impedance in the diffusion region of the battery 10. In place of the detection means of the first embodiment, the CPU of the computer 14 serving as detection means calculates a slope of a straight line that connects the reference complex impedance to the complex impedance measured by the measurement means. Further, in place of the storage means of the first embodiment, the memory serving as the storage means preliminarily stores correlations between a distance and a state of charge and correlations between a slope and a state of charge. In place of the detection means of the first embodiment, the CPU of the computer 14 serving detection means detects the state of charge of the battery 10 by use of the thus-calculated distance, the correlations between the distance and the state of charge stored in the storage means, the calculated slope, and the correlations between the slope and the state of charge stored in the storage means.

Figure 6:
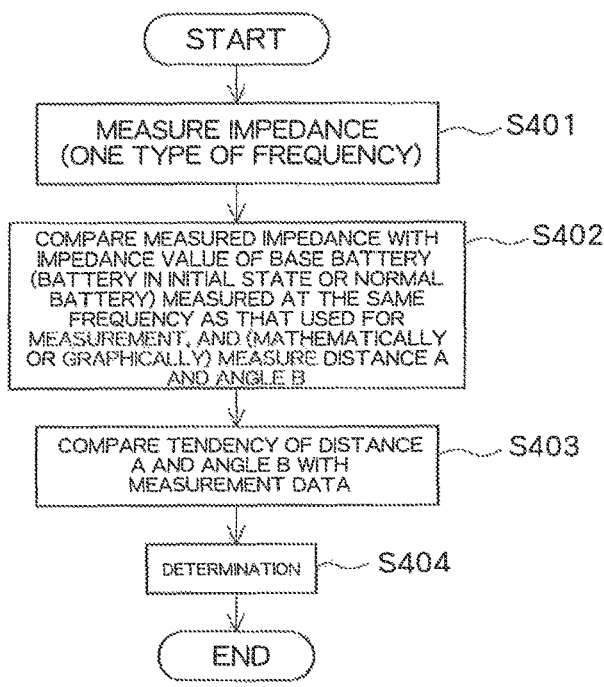
FIG. 6 It is a processing flowchart of a second embodiment.

FIG. 6 illustrates a processing flowchart of the embodiment. First, the measurement electrodes are connected to the battery 10, and the impedance measuring instrument 12 measures complex impedances of the battery 10 by application of the AC voltage to the battery 10 to be detected (S401). A frequency of the AC voltage to be applied to the battery 10 is one frequency in the diffusion region; for instance, 0.1 Hz. The frequency; however, is not limited to this value.

The computer 14 next reads from the memory, among reference complex impedances that are complex impedances in the diffusion region of the base battery which is to serve as a reference during comparison of the battery 10, a reference complex impedance whose frequency is identical with the measured frequency. The base battery herein refers to; for instance, the battery 10 in the initial state or a battery that differs from the battery 10 but is known to be normal. A straight line is drawn between the complex impedance acquired in S401 and the reference complex impedance read from the memory, and a slope of the straight line and a distance between the complex impedances are computed (S402). The slope and the distance can also be computed by means of either a mathematical or graphical (geometrical) method. The complex impedance of the base battery is a complex impedance when the SOC of the battery is known; for instance, when the SOC is 20%.

The computer 14 next compares the tendency of the distance and the slope preliminarily stored in the memory with the slope and the distance acquired by computation (S403), and the SOC of the battery 10 is determined according to the comparison result (S404).

Figure 7:
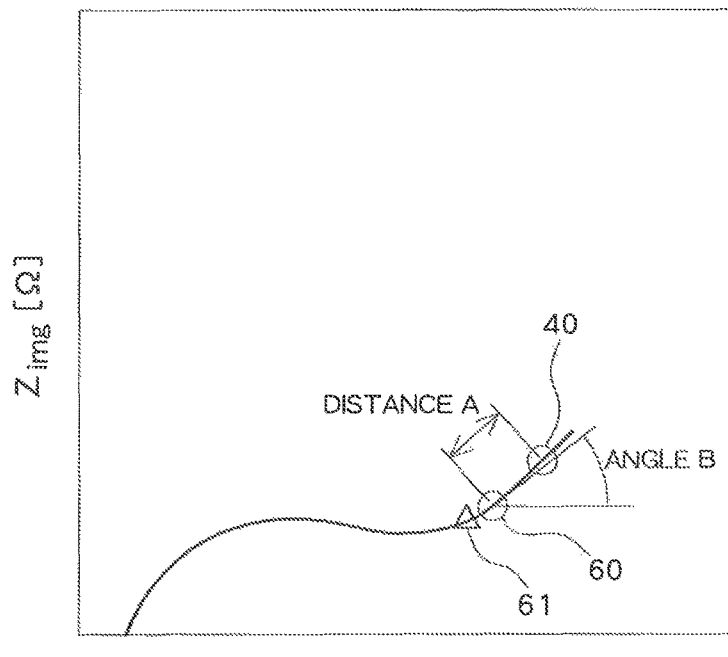
FIG. 7 It is a schematic explanatory view (a Nyquist plot) of the second embodiment.

FIG. 7 schematically illustrates processing of the embodiment. In the drawing, point 40 designates a complex impedance of a certain frequency in a diffusion region of the base battery; for instance, 0.1 Hz; point 60 designates a complex impedance of the same frequency acquired when the SOC of the battery 10 assumes a value of 30%; and point 61 designates a complex impedance of the same frequency when the SOC of the battery 10 assumes a value of 60%. As the SOC of the battery 10 changes with reference to the SOC of the base battery; the points 60 and 61 accordingly change with reference to the point 40; and the distance and the slope also change. When a capacity balance of the battery 10 to be detected is normal, the slope falls within a range from about 0 deg to 90 deg or a range from 180 deg to 270 deg. In the meantime, the distance changes as the SOC changes. Consequently, if the distance and the slope; particularly, normality of the battery 10, is known, the SOC of the battery can be detected by use of the distance.

Figure 8:
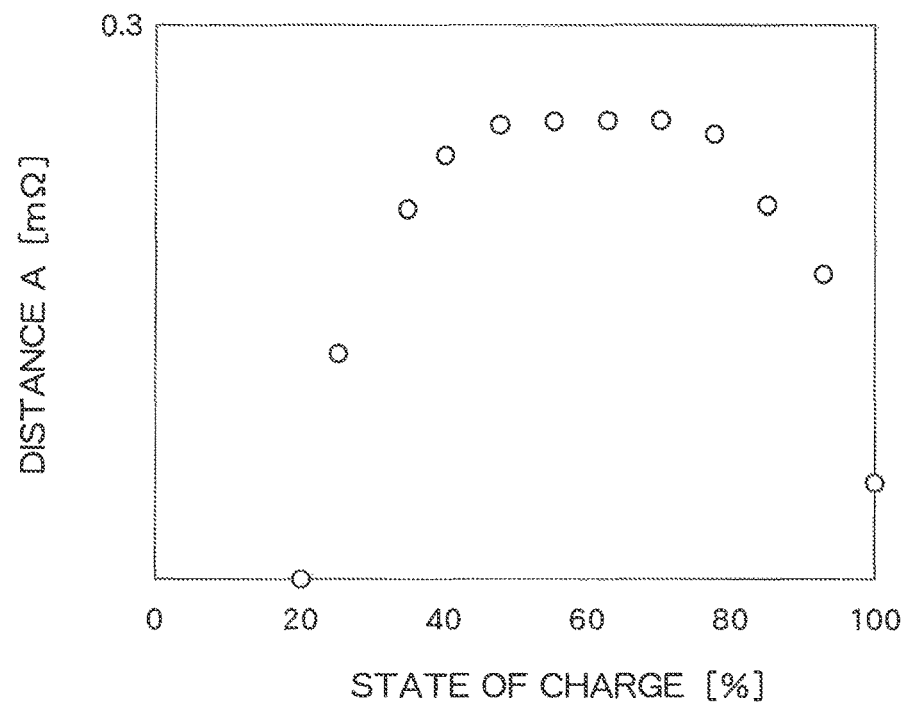
FIG. 8 It is a graph chart illustrating a relationship between a state of charge and a distance.
Figure 9:
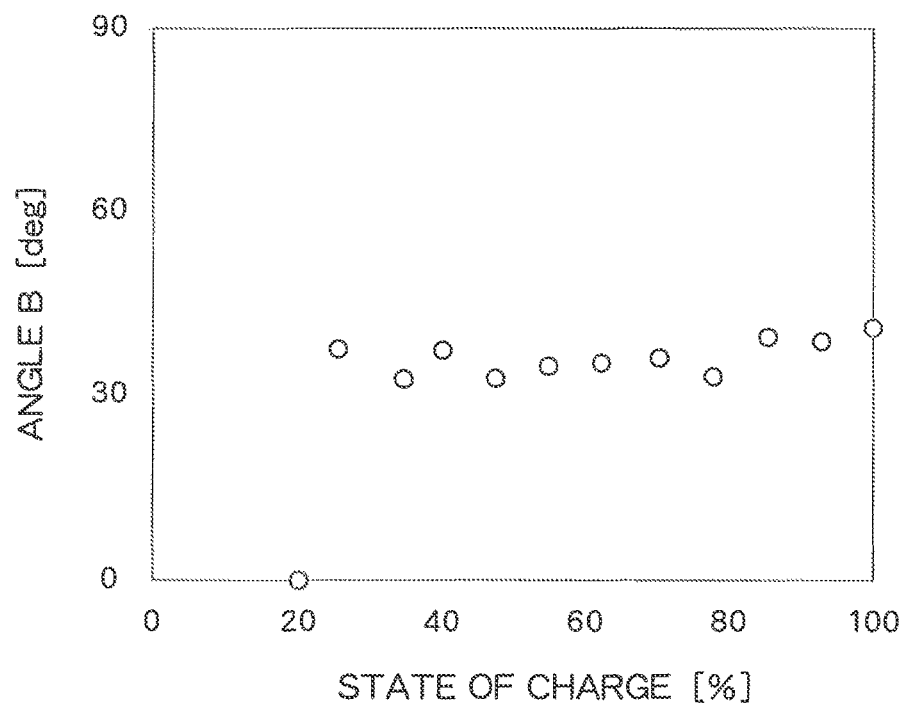
FIG. 9 It is a graph chart illustrating a relationship between a state of charge and a slope.

FIG. 8 illustrates an example correlation between an SOC of a battery and a distance. A correlation exists between the SOC and the distance. When the SOC falls within a range from 0% to 60%, the distance increases as the SOC increases. On the contrary, when the SOC falls within a range from 60% to 100%, the distance tends to decrease with an increase in SOC. A point of SOC=20% in FIG. 8 indicates the SOC of the base battery (a distance=0). Further, FIG. 9 illustrates an example correlation between an SOC of a battery and a slope. In the case of a normal battery, the slope falls within a range from about 30 deg to 45 deg when the SOC has increased with reference to the SOC of the base battery, and the SOC does not change much even if the slope has changed. In this regard, a point of SOC=20% in FIG. 9 indicates the SOC of the base battery (a slope=0).

Therefore; for instance, knowing that the SOC of the battery 10 is 60% or less but not knowing an accurate SOC, the computer 14 can detect the SOC of the battery 10 by use of the correlation between the SOC and the distance illustrated in FIG. 8 and the correlation between the SOC and the slope illustrated in FIG. 9. In the embodiment, in the case of a normal battery, the slope falls within a range of about 30 deg to 45 deg. However, since the slope slightly fluctuates according to the value of the SOC, the SOC can also be estimated from the slope.

Incidentally, the correlation between the SOC and the slope illustrated in FIG. 5 differs from the correlation between the SOC and the slope illustrate in FIG. 8. Attention should be paid to the fact that the former slope is a slope of the straight line between the complex impedances of two different frequencies in the diffusion region and that the latter slope is a slope of a straight line between the complex impedances of the same frequency in the diffusion region. In this sense, the "slope" referred to in the first embodiment means a "slope of a straight line between complex impedances of two different frequencies" and the sloe referred to in the second embodiment means a "slope of a straight line between complex impedances of a single frequency".

As described in connection with the respective embodiments, the state of charge of the battery 10 can be detected by use of the slope of the straight line between complex impedances of two different frequencies in the diffusion region in the embodiments. In addition, the state of charge of the battery 10 can be detected by use of the slope of the straight line between complex impedances of the same frequency in the diffusion region and the distance between the complex impedances.

The conditions for detection and the states of detection described in connection with the respective embodiments are summarized as follows.

First Embodiment

Frequency condition: two different frequencies in a diffusion region
Reference complex impedance (the first complex impedance): a complex impedance (which can be measured by the impedance measurement device 12 or preliminarily stored in the memory) of any one (e.g., a higher frequency) of two frequencies
Item to be detected: a slope
State of detection: a state of charge Second Embodiment Frequency condition: one frequency in the diffusion region
Reference complex impedance: a complex impedance of a battery in an initial state or a complex impedance of another normal battery (preliminarily stored in memory)
Items to be detected: a slope and a distance
State of detection: a state of charge The reference complex impedance described in connection with the first embodiment refers to the complex impedance of any one (e.g., a higher frequency) of two frequencies, so that the impedance measuring instrument 12 can measure the reference complex impedance. As a matter of course, if a complex impedance of a certain frequency in the diffusion region is preliminarily known, there will also be performed processing of preliminarily storing the complex impedance in the memory as a reference complex impedance and letting the impedance measuring instrument 12 measure a complex impedance of another frequency. Specifically, in the first embodiment, the impedance measuring instrument 12 does not necessarily need to measure complex impedances at two different frequencies. In the second embodiment, since the reference complex impedance is preliminarily stored in the memory prior to measurement of the battery 10, the impedance measuring device 12 does not need to measure the reference complex impedance.

Although the embodiments of the present invention have been described thus far, the present invention is not limited to the embodiments and susceptible to various alterations.

For instance, in the first embodiment, the slope of the straight line that connects two complex impedances of different frequencies in the diffusion region of the battery 10 is computed. However, a slope of a straight line or an approximate straight line that connects three or more complex impedances of different frequencies in the diffusion region of the battery 10 can also be computed.

A Warburg impedance and a transmission-line-model impedance are known as complex impedances in the diffusion region of the battery. In the embodiments, the state of charge of the battery is detected by use of the Warburg impedance. However, the state of charge of the battery can also be detected by use of the transmission-line-model impedance. The Warburg impedance is a known impedance relevant to hydrogen diffusion and disclosed in; for instance, Kuriyama, N., et al.: J Alloy & Compd., 202 (1993), 183 Zhang, W., et al.: Electrochem. Soc. the 185$^{th}$ Meet., (1994), abstr. No. 593

Figure 10:
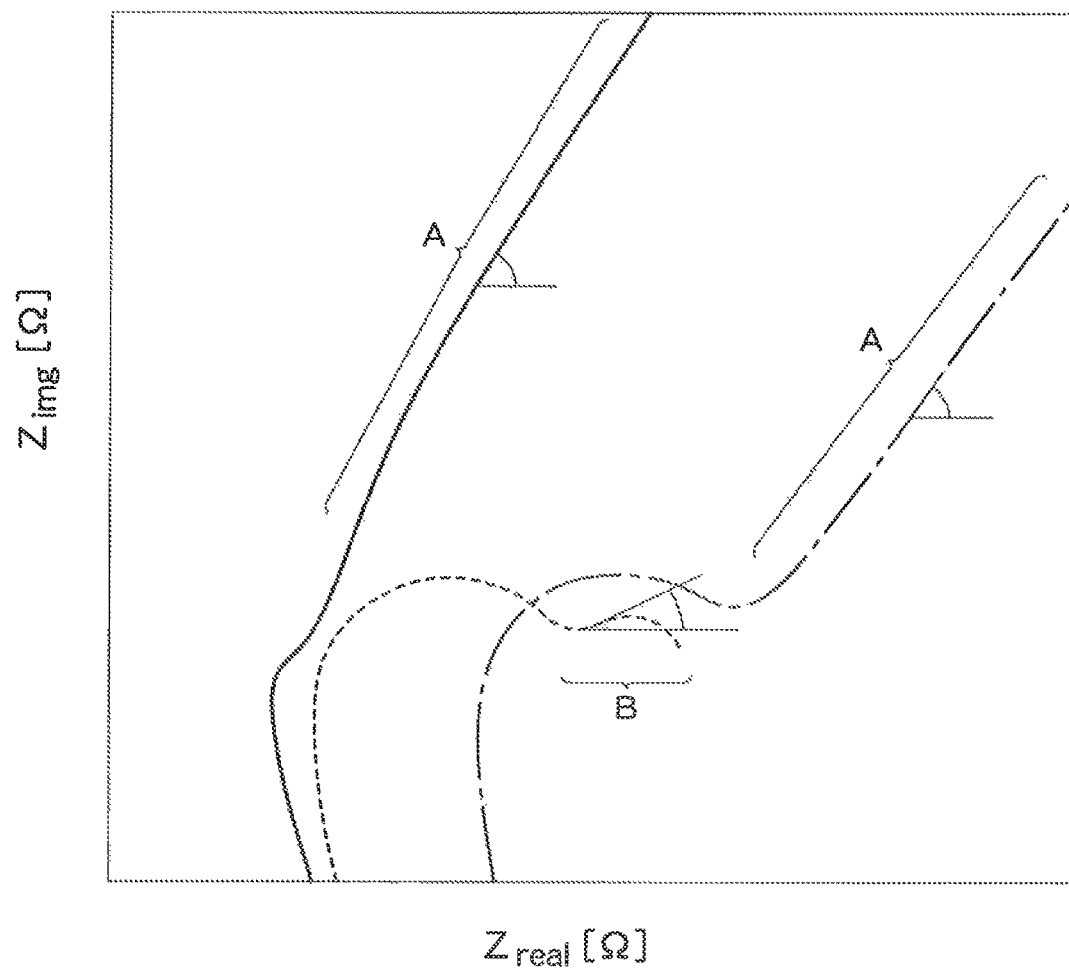
FIG. 10 It is a chart (a Nyquist plot) illustrating a Warburg impedance and a transmission-line-model impedance.

FIG. 10 illustrates a Warburg impedance and a transmission-line-model impedance. In the drawing, regions A correspond to a Warburg impedance, and region B corresponds to a transmission-line-model impedance. When an explanation is given with reference to the first embodiment, a slope of a straight line that connects together two transmission-line-model impedances of different frequencies is computed, and a state of charge of a battery is detected by use of the thus-calculated slope and correlations between a slope and a state of charge.

In addition, in the embodiments, the slope is computed by plotting complex impedances as a Nyquist plot. However, a Bode diagram can also be used. Moreover, in the embodiments, an AC voltage is applied to measure complex impedances, but a minimum requirement is application of an AC signal. Hence; for instance, an AC current, can also be applied.

The invention claimed is:

1. A rechargeable battery system, comprising:
   a rechargeable battery formed by a nickel-metal hydride battery;
   an AC voltage source connected to the rechargeable battery, wherein the AC voltage source is configured to apply AC voltage at least at two frequencies;
   an impedance analyzer connected to the rechargeable battery;
   a processing unit configured to calculate a slope of a straight line or an approximate straight line which connects together two or more complex impedances of different frequencies in the diffusion region of the battery measured by the impedance analyzer, wherein the diffusion region defines a plot of complex impedances of the battery at frequencies lower than about 10 Hertz; and
   a memory that preliminarily stores correlations between a slope and a state of charge, wherein the slope decreases as the state of charge increases,
   wherein the processing unit changes a detection method of the state of charge of the battery between when the state of charge is less than or equal to a specific threshold value of 0 to 10% and when the state of charge exceeds the threshold value, such that the processing unit detects and outputs the state of charge of the battery by comparing the calculated slope and the correlations between the slope and the state of charge stored in the memory when the state of charge of the battery is less than or equal to the threshold value and detects and outputs the state of charge of the battery in another method without using the calculated slope; and
   recycling the rechargeable battery based on the calculated state of charge.

2. The rechargeable battery system according to claim 1, wherein the processing unit calculates the slope of the straight line or the approximate straight line that connects together the two complex impedances or more of different frequencies by use of a two-dimensional plane which employs a real-axis component and an imaginary-axis component for axes.

3. The rechargeable battery system of claim 1, wherein the diffusion region defines a plot of complex impedances of the battery, which includes a curved portion and a nearly-straight portion, at frequencies lower than a point of inflection of the nearly-straight portion.

4. The rechargeable battery system of claim 1, wherein the correlations include correlations of slope angles in the diffusion region of the complex impedances with respect to the state of charge.

5. A hybrid or electric vehicle, comprising the rechargeable battery system of claim 1.

* * * * *